(12) United States Patent
Taki

(10) Patent No.: US 6,965,126 B2
(45) Date of Patent: Nov. 15, 2005

US006965126B2

(54) LIGHT-EMITTING ELEMENT

(75) Inventor: Tetsuya Taki, Nishikasugai-gun (JP)

(73) Assignee: Toyoda Gosei Co., Ltd., Nishikasugai-gun (JP)

(*) Notice: Subject to any disclaimer, the term of this patent is extended or adjusted under 35 U.S.C. 154(b) by 0 days.

(21) Appl. No.: 10/166,785

(22) Filed: Jun. 12, 2002

(65) Prior Publication Data

US 2003/0001165 A1 Jan. 2, 2003

(30) Foreign Application Priority Data

Jun. 13, 2001 (JP) .................................. P2001-177969

(51) Int. Cl.$^7$ .......................... H01L 33/00; H01L 29/06; H01L 31/0328
(52) U.S. Cl. ............................... 257/89; 257/13; 257/96
(58) Field of Search .................... 257/79–103, 13–14

(56) References Cited

U.S. PATENT DOCUMENTS 5,296,718 A * 3/1994 Fujita et al. .................. 257/14
5,777,350 A    7/1998 Nakamura et al.
6,040,588 A * 3/2000 Koide et al. .................. 257/15
6,337,536 B1 * 1/2002 Matsubara et al. .......... 313/498

FOREIGN PATENT DOCUMENTS

| JP | 08-167737 |   | 6/1996 |   |          |
|----|-----------|---|--------|---|----------|
| JP | 10-022525 |   | 1/1998 |   |          |
| JP | 10-022527 |   | 1/1998 |   |          |
| JP | 2001-53336 A | * | 2/2001 | ........... | H01L/33/00 |

* cited by examiner

Primary Examiner—Shouxiang Hu
(74) Attorney, Agent, or Firm—McGinn & Gibb, PLLC

(57) ABSTRACT

In a light-emitting element in which an n-type layer of a Group III nitride compound semiconductor, a light-emitting layer of a Group III nitride compound semiconductor and a p-type layer of a Group III nitride compound semiconductor are laminated successively on a substrate, a semiconductor layer of $Zn_xCd_{1-x}S_ySe_{1-y}$ ($0 \leq x \leq 1$, $0 \leq y \leq 1$) which receives a part of blue light from the light-emitting layer to thereby emit yellow light, is interposed between the n-type Group III nitride compound semiconductor layer and the light-emitting layer.

10 Claims, 3 Drawing Sheets

LIGHT-EMITTING ELEMENT

The present application is based on Japanese Patent Application No. 2001-177969, which is incorporated herein by reference.

BACKGROUND OF THE INVENTION

1. Field of the Invention

The present invention relates to a light-emitting element and particularly to a light-emitting element using Group III nitride compound semiconductor and Group II-Group VI compound semiconductor. The light-emitting element according to the invention can be utilized for a white light source.

2. Description of the Related Art

There is known a light-emitting element or a light-emitting device (LED) of the type which uses a Group III nitride compound semiconductor light-emitting element and a fluorescent substance in combination so that the fluorescent substance can convert the wavelength of a part of light emitted from the light-emitting element to thereby emit light in a color different from the original color of light emitted from the light-emitting element. For example, an LED of the type has been already put into practical use such that the LED of this type uses, in combination, a Group III nitride compound semiconductor light-emitting element for emitting blue light and a fluorescent substance for emitting yellow light when the fluorescent substance is excited by the blue light, with the result that white light can be emitted. The LED of this type is generally formed so that the light-release side of the light-emitting element is coated with a light-transmissive resin-containing a fluorescent substance.

In the related-art LED, a light-emitting element is coated with a fluorescent substance-containing resin (fluorescent substance resin) after the light-emitting element is produced. That is, two steps of producing a light-emitting element and coating the light-emitting element with a fluorescent substance resin are required. Hence, the production process is troublesome and complex as well as the production cost is high.

Moreover, because the light-emitting element is coated with the fluorescent substance resin by means of application, dipping or the like, it is difficult to control the coating thickness of the fluorescent substance resin accurately. For this reason, the amount of the fluorescent substance to be added is apt to vary, so that it is not easy to produce the LED with uniform quality (emission color, emission intensity, and so on).

On the other hand, the field in which LEDs can be used or applied has been widened because the white LED has been already put into practical use. With the advance of widening of the application field, demands for enhancing luminance of LEDs have been made strongly.

SUMMARY OF THE INVENTION

An object of the invention is to solve at least one of the problems. The configuration of the invention is as follows.

A light-emitting element including:

a substrate;

a primary layer made of a Group III nitride compound semiconductor for emitting primary light; and a secondary layer made of $Zn_xCd_{1-x}S_ySe_{1-y}$ ($0 \leq x \leq 1$, $0 \leq y \leq 1$) for releasing secondary light in yellow color.

In this configuration, the primary light is emitted from the primary layer made of a Group III nitride compound semiconductor on one hand and the yellow secondary light is released from the secondary layer made of $Zn_xCd_{1-x}S_ySe_{1-y}$ ($0 \leq x \leq 1$, $0 \leq y \leq 1$) on the other hand. As a result, the primary light and the secondary light are mixed with each other in terms of the color of light, so that the mixed light is radiated out. In this manner, the layer for emitting the primary light and the layer for releasing the secondary light are provided in semiconductor layers constituting the light-emitting element, that is, two kinds of light are released from the light-emitting element itself and mixed with each other in terms of the color of light. Hence, unlike the related art, application of a fluorescent substance resin for converting the wavelength of a part of light emitted from the light-emitting element becomes unnecessary after the production of the light-emitting element, so that both simplification in production process and reduction in cost can be attained.

On the other hand, light-emitting characteristic, such as the color of emitted light and the luminance of emitted light, of the light-emitting element is determined on the basis of the quantity of the primary light and the quantity of the secondary light. The quantities of these two kinds of light are controlled exclusively on the basis of the compositions and thicknesses of the primary and secondary layers. The control based on the compositions and thicknesses of the primary and secondary layers is easier than the control based on the coating thickness of the fluorescent substance layer in the coating step in the related-art LED. That is, the quantity of the primary light and the quantity of the secondary light can be controlled accurately. Hence, light-emitting elements which little vary in light-emitting characteristic can be produced with a good yield.

Moreover, the light-emitting element can be produced without necessity of coating the light-emitting element with a fluorescent substance-containing resin. That is, the light-emitting element can be used as a so-called bare chip. Hence, there is an advantage that the light-emitting element can be adapted to various mounting methods and that the degree of freedom for designing the product is high.

DETAILED DESCRIPTION OF THE PREFERRED EMBODIMENTS

Figure 1:
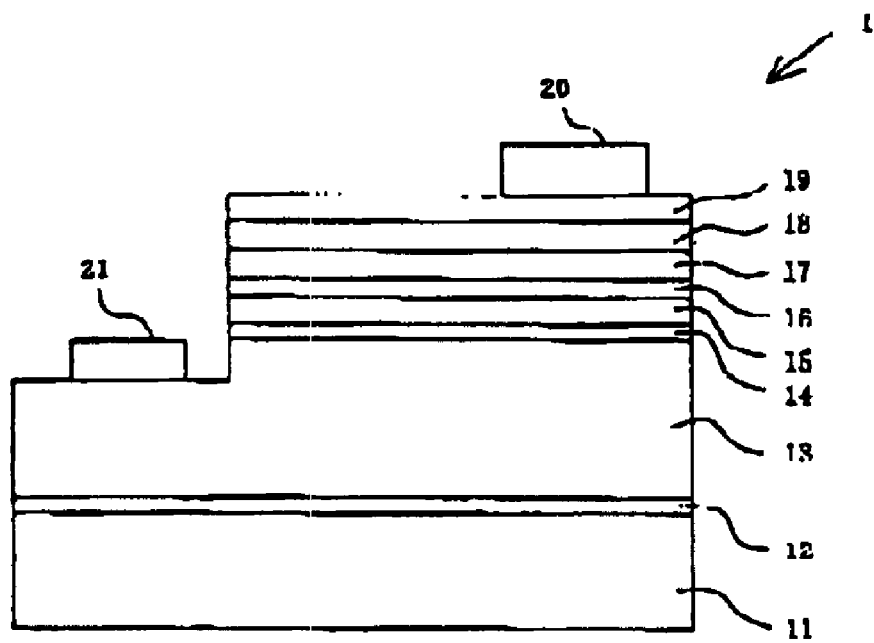
FIG. 1 is a view schematically showing the configuration of a light-emitting element 1 as an embodiment of the invention.

Respective constituent members of a light-emitting element according to the invention will be described below in detail.

The light-emitting element according to the invention includes a substrate, a primary layer made of a Group III nitride compound semiconductor for emitting primary light, and a secondary layer made of $Zn_xCd_{1-x}S_ySe_{1-y}$ ($0 \leq x \leq 1$, $0 \leq y \leq 1$) for releasing secondary light in yellow color. Incidentally, a homostructure or a single or double heterostructure, such as a p-n junction can be used as the structure of the light-emitting element.

The material of the substrate is not particularly limited. Examples of the material of the substrate which can be used include sapphire, spinel, silicon, silicon carbide, zinc oxide, gallium phosphate, gallium arsenide, magnesium oxide, manganese oxide, and Group III nitride compound semiconductor monocrystal. When a sapphire substrate is used, a surface a of the sapphire substrate is preferably used.

The primary layer is made of a Group III nitride compound semiconductor. The group III nitride compound semiconductor is expressed as quarternary compounds represented by the general formula $Al_XGa_YIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ ($0 \leq x \leq 1$). The group III elements may be at least partially replaced by boron (B), thallium (Tl), etc. The nitrogen (N) may be at least partially replaced by phosphorus (P), arsenic (As), antimony (Sb), bismuth (Bi), etc. The Group III nitride compound semiconductor layer may contain any optional dopant. Si, Ge, Se, Te, C, etc. may be used as n-type impurities. Mg, Zn, Be, Ca, Sr, Ba, etc. may be used as p-type impurities. Incidentally, after doped with p-type impurities, the Group III nitride compound semiconductor may be subjected to electron beam irradiation, plasma irradiation or heating in a furnace. This stop is not always essential.

The primary layer is configured to include a light-emitting layer. The configuration of the primary layer is not particularly limited. For example, a single quantum well structure or a multiple quantum well structure can be used. When the secondary layer is formed to emit light spontaneously as will be described later, a multiple quantum well structure with a primary quantum well layer having the primary layer and a secondary quantum well layer having the secondary layer may be used.

The primary layer can be formed by a known method such as a metal organic chemical vapor deposition method (MOCVD method), a molecular beam epitaxy method (MBE method), a halide vapor phase epitaxy method (HVPE method), a sputtering method, an ion-plating method, or an electron shower method.

The primary light emitted from the primary layer is released out after mixed with the light released from the secondary layer (which will be described later). That is, light emitted in a color obtained by mixing the primary light emitted from the primary layer and the secondary light released from the secondary layer with each other is obtained from the light-emitting element according to the invention. Hence, the color (wavelength) of the primary light can be selected suitably in accordance with the color (wavelength) of the secondary light and the total color of light emitted from the light-emitting element. From another viewpoint, the color of light emitted from the light-emitting element can be changed when the color of the primary light is changed.

With respect to the wavelength of the light emitted from the primary layer, for example, light exhibiting a peak emission wavelength in a wavelength range of from 430 nm to 560 nm, preferably blue light exhibiting a peak emission wavelength in a wavelength range of from 450 nm to 490 nm, may be used. When the primary layer emitting such light is used, the primary light emitted from the primary layer and the secondary light released from the secondary layer (which will be described later) can be mixed with each other in terms of the color of light to thereby contain emitted light in white color.

The secondary layer is a layer made of a Group II-Group VI compound semiconductor represented by the general formula $Zn_xCd_{1-x}S_ySe_{1-y}$ ($0 \leq x \leq 1$, $0 \leq y \leq 1$) for releasing a secondary light in yellow color, which has a peak emission wavelength in a wavelength range of from 530 nm to 580 nm. The secondary layer can be classified into two kinds by the form of light release as follows. That is, the secondary layer may be formed as a layer receiving a part of the light emitted from the primary layer to thereby release the secondary light (hereinafter referred to as "Group II-Group VI fluorescent substance layer") or as a layer emitting light spontaneously to thereby release the secondary light (hereinafter referred to as "Group II-Group VI light-emitting layer"). When the former layer is used as the secondary layer, a part of the primary light emitted from the primary layer is changed into the secondary light by wavelength conversion, so that light is radiated out after the light is obtained by mixing the secondary light with the other part of the primary light which has been not subjected to wavelength conversion. On the other hand, when the latter layer is used as the secondary layer, light obtained by mixing the primary light emitted from the primary layer with the secondary light emitted from the secondary layer is radiated out. Incidentally, a Group II-Group VI fluorescent substance layer and a Group II-Group VI light-emitting layer may be used in combination to form a light-emitting element.

When a Group II-Group VI fluorescent substance layer is used as the secondary layer, the material for forming the layer is preferably $Zn_xCd_{1-x}S_ySe_{1-y}$ ($0 \leq x \leq 1$, $0 \leq y \leq 1$) doped with at least one member selected from the group consisting of I (iodine), Br (bromine), and Cl (chlorine). In this case, the secondary layer is formed on the substrate directly or through another layer, independent of the primary layer. Examples of the other layer include a buffer layer and an n-type layer, each of which is made of a Group III nitride compound semiconductor. Then, the primary layer is formed on the Group II-Group VI fluorescent substance layer directly or through another layer. An example of the other layer includes an n-type layer which is made of a Group III nitride compound semiconductor.

It is conceived that crystallinity can be enhanced to improve light-emitting characteristic when the Group II-Group VI fluorescent substance layer is formed between the substrate and the primary layer. The layer made of the Group II-Group VI compound semiconductor can relax lattice distortion of a foundation located under the Group II-Group VI compound semiconductor layer because the Group II-Group VI compound semiconductor requires lower energy for producing crystal defects than the Group III nitride compound semiconductor.

The Group II-Group VI fluorescent substance semiconductor layer can be formed by a known method such as a metal organic chemical vapor deposition method (MOCVD method), a molecular beam epitaxy method (MBE method), a halide vapor phase epitaxy method (HVPE method), a sputtering method, an ion-plating method, or an electron shower method.

A plurality of Group II-Group VI fluorescent substance layers may be provided as the secondary layer. In this case, layers different in composition may be used in combination.

When the Group II-Group VI light-emitting layer is used as the secondary layer, the secondary layer emits light in the same manner as the primary layer. That is, a multiple quantum well structure including at least one primary quantum well layer having the primary layer, and at least one secondary quantum well layer having the secondary layer may be formed. On this occasion, the number of primary quantum well layers and the number of secondary quantum well layers are not particularly limited. For example, the number of primary quantum well layers may be selected to be in a range of from 1 to 10 and the number of secondary quantum well layers may be selected to be in a range of from 1 to 10.

The sequence of lamination of the primary and secondary quantum well layers is not particularly limited. When, for example, two primary quantum well layers and two secondary quantum well layers are used, these layers can be laminated as follows. In one form, two primary quantum well layers may be arranged continuously on the substrate side, and two secondary quantum well layers may be arranged continuously in succession to the two primary quantum well layers. In another form, two secondary quantum well layers may be arranged continuously on the substrate side, and two primary quantum well layers may be arranged continuously in succession to the two secondary quantum well layers. In a further form, primary quantum well layers and secondary quantum well layers may be arranged alternately on the substrate side. In a still further form, secondary quantum well layers and primary quantum well layers may be arranged alternately on the substrate side. Incidentally, barrier layers are interposed between the quantum well layers. Each of the barrier layers may be made of a Group III nitride compound semiconductor or of a Group II-Group VI compound semiconductor. All the barrier layers need not have the same composition, that is, barrier layers different in composition may be used in combination.

A layer containing a fluorescent substance (hereinafter referred to "second fluorescent substance layer") which is excited by the primary light emitted from the primary layer to generate fluorescence may be provided separately. For example, such second fluorescent substance layers may be provided between the primary layer and the secondary layer and between the secondary layer and the substrate. When the second fluorescent substance layer is used, the wavelength of a part of light emitted from the primary layer can be converted so that the color of light emitted from the light-emitting element as a whole can be changed or corrected. The fluorescent substance is not limited on kind if it is excited by light emitted from the primary layer to emit light. Examples of the fluorescent substance which can be used include rare-earth elements such as La (lanthanum), Ce (cerium), Pr (praseodymium), Nd (neodymium), Sm (samarium), Gd (gadolinium), Dy (dysprosium), Er (erbium), Eu (europium), Tb (terbium), Ho (holmium), Tm (thulium), Yb (ytterbium), and Lu (lutetium). Although it is a matter of course that these rare-earth elements can be used singly as the fluorescent substance, two or more members selected optionally from these rare-earth elements may be used in combination as the fluorescent substance. Preferably, Eu and/or Tb may be used as the fluorescent substance. Light emitted from these fluorescent substances exhibits a sharp line spectrum.

Such a fluorescent substance may be contained in any one of the semiconductor layers constituting the light-emitting element. When, for example, an element structure having an n-type Group III nitride compound semiconductor layer, a secondary layer, a primary layer and a p-type Group III nitride compound semiconductor layer is used, the fluorescent substance can be contained in any one of these layers or in a plurality of layers selected optionally from these layers. When a buffer layer of a Group III nitride compound semiconductor is used between the substrate and the n-type Group III nitride compound semiconductor layer, the fluorescent substance may be contained in the buffer layer. The fluorescent substance may be contained in all the Group III nitride compound semiconductor layers.

When a large amount of the fluorescent substance needs to be added, it is preferably that the fluorescent substance is contained in a Group III nitride compound semiconductor layer large in thickness such as an n-contact layer. This is because a large amount of the fluorescent substance can be added while the influence on the crystallinity of the layer is suppressed when the layer is large in thickness. It is a matter of course that the fluorescent substance may be contained in a plurality of semiconductor layers so that a larger amount of the fluorescent substance can be added.

When a multiple quantum well structure is used, it is preferable that the fluorescent substance is contained in each barrier layer. This is because the fluorescent substance can be efficiently irradiated with light emitted from the quantum well layers.

According to the invention, light-emitting elements capable of emitting light in various colors (at various wavelengths) as well as the white light can be formed. The light-emitting elements according to the invention can be used for forming light-emitting devices such as a bullet type LED and an SMD type LED. Such light-emitting devices can be used as light sources for various kinds of display devices such as a signal, a display board and a display unit.

The configuration of the invention will be described below more in detail in connection with embodiments thereof. FIG. 1 is a view schematically showing the configuration of a light-emitting element 1 which is an embodiment of the invention. Specifications of respective layers in the light-emitting element 1 are as follows.

| Layer | Composition: Dopant |
|---|---|
| Sixth layer 18 | p-AlGaN: Mg |
| Fifth layer 17 | p-AlGaN: Mg |
| Fourth layer 16 | Layer including an InGaN layer |
| Third layer 15 | n-AlGaN: Si |
| Second layer 14 (fluorescent) | ZnSe: I (thickness: 10 $\mu$m) |
| First layer 13 | n-GaN: Si |
| Buffer layer 12 | AlN |
| Substrate 11 | Sapphire |

The buffer layer 12 is used for growing high-quality semiconductor layers. Although this embodiment shows the case where the buffer layer is made of AlN, the invention is not limited thereto. For example, a binary compound such as GaN or InN, a Group III nitride compound semiconductor (ternary compound) generally represented by $Al_xGa_yN$ ($0<x<1$, $0<y<1$, $x+y=1$) or a Group III nitride compound semiconductor (quarternary compound) represented by $Al_aGa_bIn_{1-a-b}N$ ($0<a<1$, $0<b<1$, $a+b<1$) may be used as the material of the buffer layer.

The structure of the fourth layer 16 (including a light emitting layer as a primary layer) is not limited to a multiple quantum well structure. For example, a single quantum well structure may be used as the structure of the fourth layer 16. The quantum well layer may be made of InGaAlN, inclusive of InN, GaN, InGaN and InAlN. The barrier layer may be made of InGaAlN, inclusive of GaN, InGaN, InAlN and AlGaN, which is larger in energy gap than the quantum well layer.

A homostructure, heterostructure or a double heterostructure may be used as the structure of the fourth layer.

The layers are formed in the following structure. First, while a hydrogen gas is circulated into a reactor of an MOCVD apparatus, a sapphire substrate 11 is heated to 1,150° C. so that a surface of the sapphire substrate 11 is cleaned. Then, in a state in which the substrate temperature is kept constant, TMA and $NH_3$ are introduced into the reactor so that a buffer layer 12 is grown by an MOCVD method. Then, a mixture gas of TMG, $NH_3$ and Si source is introduced into the reactor so that a first layer 13 is grown by the same MOCVD method.

Then, the supply of TMG and Si source is stopped and the substrate temperature is dropped to 500° C. After dropping in temperature, the supply of $NH_3$ is stopped. Then, DMZn (dimethyl zinc), DMSe (dimethyl selenium) and EI (ethyl iodine) as a dopant material are supplied so that a second layer 14 as a Group II-Group VI fluorescent substance layer is grown. After the second layer 14 is grown to a desired thickness, the supply of DMZn and the dopant material is stopped and the substrate temperature is raised to 1,150° C. Then, the supply of DMSe is stopped.

After these steps, a third layer 15, a fourth layer 16, a fifth layer 17 and a sixth layer 18 are formed according to an ordinary method (MOCVD method).

After the sixth layer 18 is formed, the wafer is taken out from the inside of the MOCVD apparatus. A light-transmissive electrode 19, a p electrode 20 and an n electrode 21 are formed as follows. First, while Ti/Ni is used as a mask, the six layer 18, the fifth layer 17, the fourth layer 16, the third layer 15, the second layer 14 and the first layer 13 are partially removed by reactive ion etching to thereby reveal the first layer 13 on which the n electrode 20 will be formed. Then, after a photo resist is applied on a semiconductor surface uniformly, the photo resist on a portion of the sixth layer 18 on which the electrode will be formed is removed by photolithography to thereby reveal the sixth layer 18 in this portion. The light-transmissive electrode 19 of Au/Co is formed on the revealed portion of the sixth layer 18 by a vapor deposition apparatus. Then, the p electrode 20 of Au is formed on the light-transmissive electrode 19 by vapor deposition. The n electrode 21 composed of two layers of Al and V is formed on the revealed portion of the first layer 13 by vapor deposition in the same manner as described above. After these steps, the wafer is separated into chips.

Figure 2:
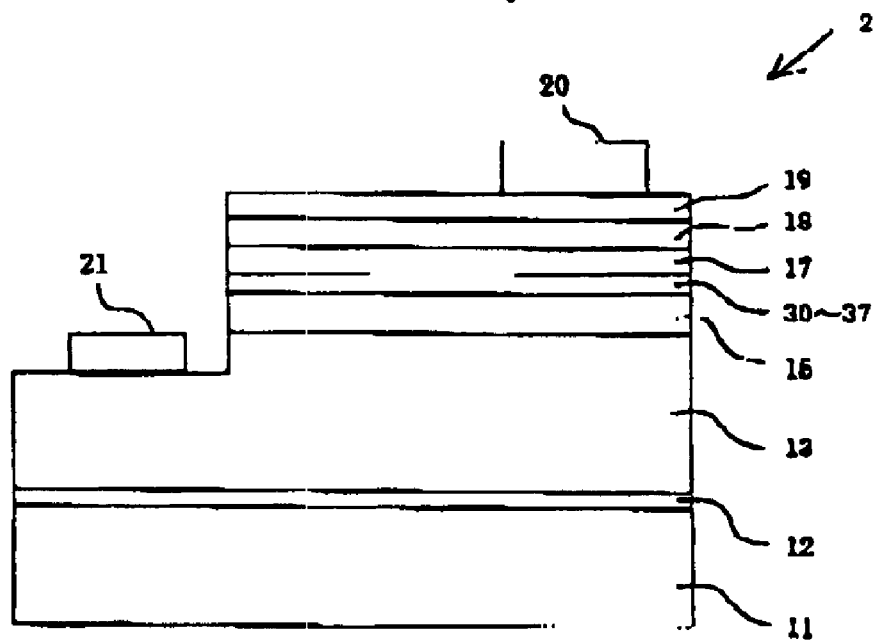
FIG. 2 is a view schematically showing the configuration of a light-emitting element 2 as another embodiment of the invention.
Figure 3:
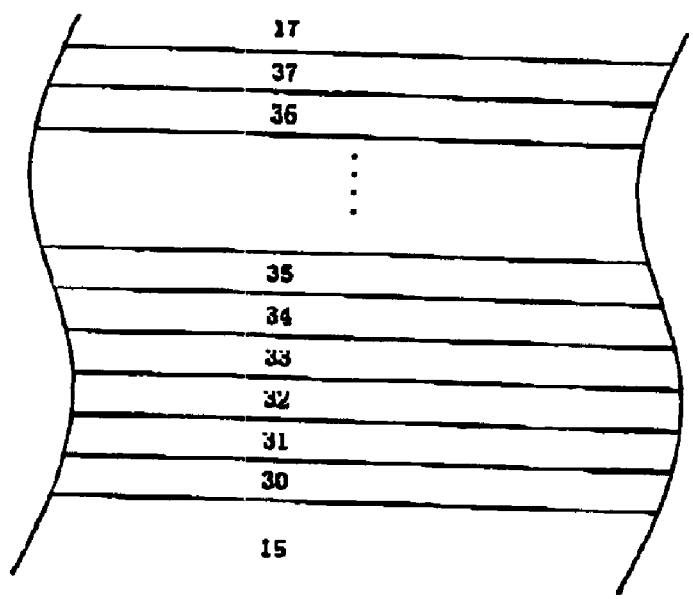
FIG. 3 is a view schematically showing the configuration of a region of from the tenth layer to the seventeenth layer in the light-emitting element 2.

Next, a light-emitting element 2 as another embodiment of the invention will be described below. FIG. 2 schematically shows the configuration of the light-emitting element 2. The layer structure of the light-emitting element 2 is as follows. Incidentally, layers and members the same as those in the light-emitting element 1 are referenced correspondingly and the description of these layers and members is omitted.

| Layer | Composition: Dopant |
| --- | --- |
| Sixth layer 18 | p-AlGaN: Mg |
| Fifth layer 17 | p-AlGaN: Mg |
| Seventeenth layer 37 | GaN (3.5 nm) |
| Sixteenth layer 36 | $In_{0.15}Ga_{0.85}N$ (3.5 nm) |
| ... | ... |
| Fifteenth layer 35 | $Zn_{0.1}Cd_{0.9}S_{0.2}Se_{0.8}$ (3.5 nm) |
| Fourteenth layer 34 | GaN (3.5 nm) |
| Thirteenth layer 33 | $In_{0.15}Ga_{0.85}N$ (3.5 nm) |
| Twelfth layer 32 | GaN (3.5 nm) |
| Eleventh layer 31 | $Zn_{0.1}Cd_{0.9}S_{0.2}Se_{0.8}$ (3.5 nm) |
| Tenth layer 30 | GaN (3.5 nm) |
| Third layer 15 | n-AlGaN: Si |
| Second layer 13 | n-GaN: Si |
| Buffer layer 12 | AlN |
| Substrate 11 | Sapphire |

The region of from the tenth layer to the seventeenth layer has a structure in which layers of Group III nitride compound semiconductors and layers of Group II-Group VI compound semiconductors are repeatedly laminated through barrier layers. Each of the tenth layer 30, the twelfth layer 32, the fourteenth layer 34 and the seventeenth layer 37 may be made of a Group III nitride compound semiconductor ($Al_X Ga_Y In_{1-X-Y} N$ ($0 \leq X \leq 1$, $0 \leq Y \leq 1$, $0 \leq X+Y \leq 1$)) or a Group II-Group VI compound semiconductor ($Zn_y Cd_{1-x} S_y Se_{1-y}$, ($0 \leq x \leq 1$, $0 \leq y \leq 1$)) which is larger in energy gap than any one of the thirteenth layer 33 and the sixteenth layer 36 as primary quantum well layers and the eleventh layer 31 and the fifteenth layer 35 as secondary quantum well layers.

The region of from the tenth layer to the seventeenth layer can be produced as follows. The buffer layer 12, the second layer 13 and the third layer 15 are laminated successively on the substrate 11 in the same manner as in the light emitting element 1. Then, in a state in which the substrate temperature is kept constant at the growth temperature (1,150° C.) of the third layer 15, TGM and $NH_3$ are supplied into the MOCVD apparatus so that the tenth layer 30 is grown. Then, the supply of TMG is stopped and the substrate temperature is dropped to 500° C. After dropping in temperature, the supply of $NH_3$ is stopped. Then, DMZn (dimethyl zinc), DMCd (dimethyl cadmium), DES (diethyl sulfur) and DMSe (dimethyl selenium) are supplied so that the eleventh layer 31 is grown. After the eleventh layer 31 is grown to a desired thickness, the supply of DMZu and DMCd is stopped and the substrate temperature is raised to 1,150° C. In this state, the supply of DES and DMSe is stopped. Then, TMG and $NH_3$ are supplied so that the twelfth layer 32 is formed in the same manner as the tenth layer 30. Then, in a state in which the substrate temperature is kept constant, the raw material gas is exchanged into a mixture gas of TMI, TMG and $NH_3$ so that the thirteenth layer 33 is grown. In this manner, the region of from the tenth layer 30 to the thirteenth layer 33 is formed. This growth cycle is repeated by required several times to form the region of from the tenth layer to the seventeenth layer.

After the seventh layer 37 is formed, the production process is carried out in the same manner as in the light-emitting element 1.

Figure 4:
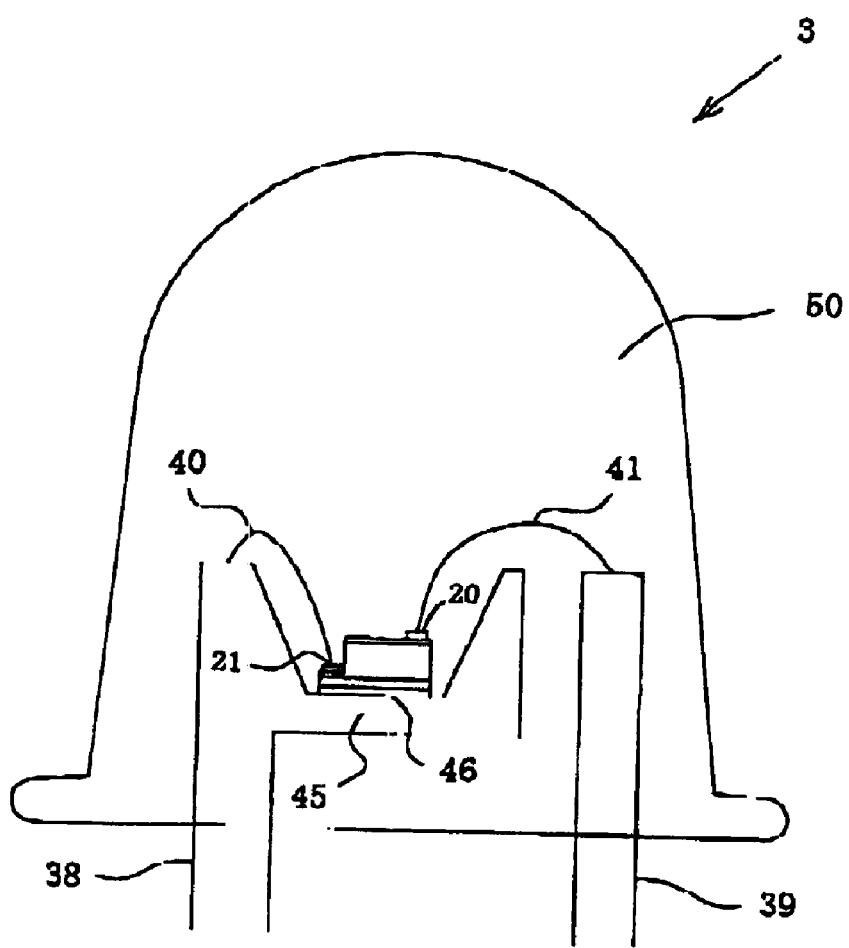
FIG. 4 is a view showing an LED 3 formed by use of the light-emitting element 1.

The light-emitting element 1 or 2 produced as described above can be used for forming an LED. FIG. 4 shows an LED 3 as an example of use of the light-emitting element 1. The LED 3 can be produced as follows. First, the light-emitting element 1 is mounted, by an adhesive agent 46, into a cup portion 45 provided in a lead frame 38. The adhesive agent 46 is silver paste which is composed of an epoxy resin, and silver as a filler mixed with the epoxy resin. When such silver paste is used, heat can be radiated from the light-emitting element 1 better.

The p electrode 20 and the n electrode 21 in the light-emitting element 1 are wire bonded to lead frames 39 and 38 by wires 41 and 40 respectively. Then, the light-emitting element 1, part of the lead frames 38 and 39 and the wires 40 and 41 are sealed with a sealing resin 50 made of an epoxy resin. The material of the sealing resin 50 is not particularly limited so long as the material is transparent.

Besides the epoxy resin, a silicone rein, an urea resin or glass may be used preferably.

The sealing resin 50 is provided for protecting the element structure. When the shape of the sealing resin 50 is changed in accordance with the purpose, a lens effect can be given to the sealing resin 50. For example, the sealing resin 50 may be molded into a concave lens shape or a convex lens shape as well as the round shape shown in FIG. 4. The shape of the sealing resin 50 viewed from the light-extracting direction (above in FIG. 4) may be also a circular shape, an elliptic shape of a rectangular shape.

The sealing resin 50 may contain a fluorescent substance which is excited by light emitted from the light-emitting element 1 to thereby emit light. Alternatively, the cup portion 45 of the lead frame 38 may be filled with such a fluorescent substance-containing resin.

The sealing resin 50 may also contain a diffusing agent. When the diffusing agent is used, the directivity of light emitted from the light-emitting element 1 can be relaxed. Examples of the diffusing agent used included titanium oxide, titanium nitride, tantalum nitride, aluminum oxide, silicon oxide, and barium titanate.

In the LED 3, blue light is emitted from the fourth layer 16 in the light-emitting element 1. Upon reception of a part of the blue light, the second layer 14 releases yellow light. The yellow light and the other part of the blue light which has been not used for light release from the second layer 14 are mixed with each other in terms of the color of light, so that white light is radiated out finally.

The description has been made above upon the case where the light-emitting element 1 is used for forming an LED. When the light-emitting element 2 is used instead of the light-emitting element 1 for forming an LED in a similar manner, blue light caused by light emission of primary quantum well layers is emitted from the thirteenth layer 33 and the sixteenth layer 36 in the light-emitting element 2 and yellow light caused by light emission of secondary quantum well layers is emitted from the eleventh layer 31 and the fifteen layer 35 in the light-emitting element 2. These two kinds of light are mixed with each other in terms of the color of light, so that white light is radiated out finally.

The invention is not limited at all to the description of the mode for carrying out the invention. The laminate as an intermediate of the light-emitting element may be the subject of the invention. The invention includes various modifications that can be conceived easily by those skilled in the art, without departing from the description of the scope of claim.

What is claimed is:

1. A light-emitting element, comprising:
    a substrate;
    a primary layer comprising a Group III nitride compound semiconductor emitting primary light;
    a secondary layer comprising $Zn_xCd_{1-x}S_ySe_{1-y}$, where $0 \leq x \leq 1$, $0 \leq y \leq 1$, said secondary layer releasing a secondary light of a yellow color; and
    an n-type layer disposed below said primary layer,
    wherein said secondary layer is interposed between said primary layer and said n-type layer, and
    wherein said n-type layer comprises a Group-III nitride compound semiconductor.

2. A light-emitting element according to claim 1, wherein said secondary layer is doped with at least one of I, Br, and Cl, and absorbs a part of said primary light emitted from said primary layer to thereby release said secondary light.

3. A light-emitting element according to claim 1, wherein said secondary layer emits light spontaneously to thereby release said secondary light.

4. A light-emitting element according to claim 1, wherein said primary layer emits the primary light exhibiting a peak emission wavelength in a wavelength range of from 430 nm to 560 nm, and said secondary layer emits the secondary light exhibiting a peak emission wavelength in a wavelength range of from 530 nm to 580 nm.

5. A light-emitting element according to claim 1, wherein a white light is emitted outwardly.

6. A light-emitting element according to claim 1, wherein said substrate comprises one of sapphire, spinel, silicon, silicon carbide, zinc oxide, gallium phosphate, gallium arsenide, magnesium oxide, manganese oxide, and a Group III nitride compound semiconductor monocrystal.

7. A light-emitting element according to clam 1, further comprising:
    a second fluorescent layer comprising at least one of lanthanum, cerium, praseodymium, neodymium, samarium, gadolinium, dysprosium, erbium, europium, terbium, holmium, thulium, ytterbium, and lutetium.

8. The light-emitting layer according to claim 1, wherein said n-type layer comprises GaN.

9. A light-emitting element, comprising:
    a substrate;
    a Group III nitride compound semiconductor layer for emitting a first light;
    a $Zn_xCd_{1-x}S_ySe_{1-y}$ layer, where $0 \leq x \leq 1$, $0 \leq y \leq 1$, that releases a yellow light; and
    an n-type layer disposed below said Group III nitride compound semiconductor layer,
    wherein said $Zn_xCd_{1-x}S_ySe_{1-y}$ layer is interposed between said Group III nitride compound semiconductor layer and said n-type layer, and
    wherein said n-type layer comprises a Group-III nitride compound semiconductor.

10. The light-emitting layer according to claim 9, wherein said n-type layer comprises GaN.

* * * * *